United States Patent [19]

Bibring et al.

[11] 4,318,756

[45] Mar. 9, 1982

[54] MULTI-PHASE METALLIC SYSTEMS OF THE γ,γ', NBC TYPE WITH IMPROVED STRUCTURAL STABILITY

[75] Inventors: Herve Bibring, Meudon; Tasadduq Khan, Plessis Robinson; Maurice Rabinovitch, Chatillon; Jean-Francois Stohr, Bourg-la-Reine; Jean-Michel Hauser, Meudon, all of France

[73] Assignee: Office National d'Etudes et de Recherches Aerospatiales O.N.E.R.A., Chatillon, France

[21] Appl. No.: 93,118

[22] Filed: Nov. 13, 1979

[30] Foreign Application Priority Data

Nov. 14, 1978 [FR] France .................... 78 32151

[51] Int. Cl.$^3$ ............................... C22C 19/05
[52] U.S. Cl. ........................ 148/32.5; 75/171
[58] Field of Search ............. 75/170, 171; 148/32, 148/32.5

[56] References Cited

U.S. PATENT DOCUMENTS

| 3,799,769 | 3/1974 | Tarshis et al. | 75/171 |
| 3,904,402 | 9/1975 | Smashey | 75/170 |
| 4,043,841 | 8/1977 | Bibring et al. | 75/171 |

FOREIGN PATENT DOCUMENTS

| 1295848 | 3/1969 | Fed. Rep. of Germany . |
| 2018770 | 1/1975 | Fed. Rep. of Germany . |
| 2540513 | 2/1980 | Fed. Rep. of Germany . |
| 2040931 | 1/1971 | France . |
| 2071294 | 9/1971 | France . |
| 2109184 | 5/1972 | France . |
| 2167235 | 8/1973 | France . |
| 2338332 | 8/1977 | France . |
| 1378819 | 12/1974 | United Kingdom . |
| 1475711 | 6/1977 | United Kingdom . |
| 1501224 | 2/1978 | United Kingdom . |
| 1517332 | 7/1978 | United Kingdom . |

OTHER PUBLICATIONS

Bibring et al., Memories Scientifiques Rev. Metallurg., pp. 341–358, LXIX, No. 5, 1972.
Raman, Z. Metallkde., pp. 163–172, bd. 68 (1977) H.3.
Buchanan et al., Metallurgical Transactions, vol. 4, Aug. 1973, pp. 1895–1904.

*Primary Examiner*—R. Dean
*Attorney, Agent, or Firm*—Karl F. Ross

[57] ABSTRACT

A refractory composite material has a nickel-based matrix, containing chromium, hardened by elements such as W in solid solution and hardened by precipitation of a $\gamma'(Ni,Xi)_3(Al,Yi)$ phase, Xi representing elements different from Ni and Yi elements different from Al which the matrix may contain and which are respectively substituted for Ni and Al atoms in the formation of the $\gamma'$ precipitate, and with aligned monocrystalline fibers of a transition metal monocarbide, preferably niobium monocarbide, imbedded in said matrix, as obtained by unidirectional solidification. The chromium proportion of the material is maintained at a value lower than that from which the chromium carbide of formula $Cr_{23}C_6$ is formed in the matrix at the expense of the niobium carbide of the reinforcement fibers at the operating temperatures foreseen for the material.

17 Claims, No Drawings

MULTI-PHASE METALLIC SYSTEMS OF THE γ,γ', NBC TYPE WITH IMPROVED STRUCTURAL STABILITY

BACKGROUND OF THE INVENTION

Metallic materials are known which comprise, imbedded in a matrix, aligned monocrystalline metallic monocarbide fibers of the formula MC, M being the metal and C the chemical symbol of carbon, formed by unidirectional solidification and the mechanical properties of which at high temperatures are well beyond those of standard super-alloys. Such composite materials have been the object of U.S. Pat. No. 3,871,835.

Such materials offer a very profitable route for technical applications at high temperatures.

In the aeronautic field for instance, where the desired increase for the performance of the gas turbines requires increasingly higher gas temperatures and rotation speeds, these materials offer decisive advantages for the manufacturing of the blades.

In this general program, complex composite materials with a very high strength have been developed, based on Ni, Fe and Co, the reinforcement being obtained by monocrystalline fibers in a monocarbide of a transition metal, such as TaC, NbC or TiC.

Materials particularly adapted for aeronautic use are Ni-based and their reinforcement is obtained with NbC fibers. They are practically insensitive to thermal cycling, viz. to repeated temperature variations in the operating conditions of aircraft.

As disclosed in U.S. Pat. No. 4,043,841 the compositions of said materials are within the following limits:

| Cr | 6 to 15% |
|---|---|
| W | 7 to 10% |
| Al | 3 to 6% |
| Nb | 4 to 6% |
| C | 0.4 to 0.65% |
| Ni + Co | balance to 100. |

In said materials, the matrix, which is Ni- and Co-based, is hardened by the presence of tungsten in solid solution.

The matrix is also hardened by precipitation in its solid solution, or γ phase, of an ordered γ' phase of the $Ni_3Al$ type.

It had been established that the resistance to the thermal cycling of such materials increases in proportion to the hardening of the matrix, viz. with increasing Al and W contents.

It has now been established that the precipitation in the solid solution of the ordered γ' phase calls upon not only the Ni, but also upon one or several of the other elements present in the solid solution, whereby atoms of said elements can be substituted for the Ni atoms and the Al atoms in the lattice formed by the γ', $Ni_3Al$ phase. The phase obtained is in fact a phase of the γ', $(Ni,Xi)_3(Al,Yi)$ type, Xi representing the various elements which have been substituted for Ni atoms in the lattice and Yi those which have been substituted for the Al atoms.

Thus, these materials comprise three phases, viz. a solid solution which is Ni- and Co-based, a γ'$(Ni,Xi)_3$-$(Al,Yi)$ precipitate—these two phases forming the matrix as such—and a third phase formed by the reinforcement fibers.

OBJECTS OF THE INVENTION

The object of the invention is to still further improve upon said composite materials especially with the aim of obtaining materials preserving substantially their exceptionally advantageous characteristics, in particular their resistance to the thermal cycling and their resistance to creep at high temperature during extended service periods of the order of 5000 hours.

A new problem is then set, which is that of the structural stability of said materials, viz. the maintaining in said materials of the three hereabove mentioned phases only, viz. the γ solid solution, the γ' precipitate, and the reinforcement fibers.

An object of the invention thus is precisely to define composite material compositions for which the structural stability remains preserved even during very long service periods at a high temperature.

Another object of the invention is to provide composite materials with γ,γ' phases and NbC monocrystalline reinforcement fibers, comprising a Ni-based matrix containinf chromium and eventually cobalt, hardened by the presence in the solid solution (γ phase) of elements such as W and/or Mo and also by a precipitate γ' of the $(Ni,Xi)_3(Al,Yi)$ type, which materials remain structurally stable for long service periods.

DESCRIPTION OF THE INVENTION

The invention is based on our discovery of the existence in the quaternary system Ni—Cr—Nb—C, below 1000° C., of a three-phase domain (Ni,Cr)—NbC—$Cr_{23}C_6$, this existence having been experimentally established between 800° and 1000° C., by electronic diffraction and X-rays as well as by microanalysis.

It has been established that within this three-phased domain, a portion of the niobium carbide NbC which forms the aligned fibers obtained during the unidirectional solidification is progressively transformed into chromium carbide $Cr_{23}C_6$ when the material is kept for a very long period at an average temperature of the order of 800° to 1000° C.

In a system more complex than Ni—Cr—Nb—C, for instance a quinary system, the development of $Cr_{23}C_6$ carbide—depending substantially on the Cr content—is also a function of the content of other elements. For example, the increasing addition of Al provides a more and more abundant precipitation of the γ',$Ni_3Al$ phase. Taking in to account the preferential distribution of Cr between the present phases, the larger the volume fraction of γ' precipitate, the larger the Cr enrichment of the remaining γ solid solution. As a matter of fact—and this is precisely what the thorough analysis of the stability phenomenon of the NbC carbide in a complex system has shown—whatever the composition complexity of the composites γ,γ',NbC, the stability of the NbC fibers depends only on the composition of the γ solid solution of the matrix.

Other elements, added more particularly for the reinforcement by γ' and MC (Ti, Zr, V, Hf, Ta) or for the hardening in solid solution, for instance W and/or Mo are distributed no less unequally between phases γ,γ', MC and $M'_{23}C_6$. Their respective contents therefore have to be strictly controlled for ensuring a composition of the γ phase which does not favor the appearance of the $M'_{23}C_6$ phase at the expense of MC. (The Cr carbide admits the partial substitution (replacement) of Cr atoms by atoms of other elements such as W, Mo, etc.;

this is why the formula is written here indifferently as $Cr_{23}C_6$ or $M'_{23}C_6$).

The invention defines means allowing minimizing and even preventing the appearance of chromium carbide $Cr_{23}C_6$ which is formed in dispersion in the matrix at the expense of the NbC constituent of the reinforcement fibers; the formation of the $Cr_{23}C_6$ phase would reduce the volume fraction of said fibers and affect the mechanical properties of the composite material.

Whether the matrix is with four constituents or with five constituents, or even with a larger number of constituents, the invention provides the prescriptions relative to the composition which must be respected so that after the formation of a material by unidirectional solidification according to a matrix comprising a solid solution ($\gamma$ phase), a precipitate of the $(Ni,Xi)_3(Al,Yi)$ type ($\gamma'$ phase) and in which is present a phase of monocrystalline reinforcement fibers in niobium monocarbide NbC, the development of a $Cr_{23}C_6$ carbide is prevented.

In this respect, the invention requires that whatever the elements constituting the material, the quantity of chromium in the starting composition is such that the chromium content of the $\gamma$ solid solution is less than or equal to 15% by weight.

The invention also provides that, for a material of the following composition:

| Ni | base |
|---|---|
| Co | 0 to 20% by weight |
| W | 7 to 14% by weight |
| Al | 4 to 7% by weight |
| Nb | 3.5 to 6% by weight |
| C | 0.35 to 0.65% by weight | the material further comprising Cr, the chromium content of the starting system should be less than or equal to 10% by weight.

The invention further provides that as the aluminum content is higher, the lower will be the chromium content suitable for meeting the hereabove requirement.

Under such conditions, by respecting the hereabove limitations, the usual development processes by unidirectional solidification lead to a nickel-based material with monocrystalline fibers in niobium monocarbide exhibiting very good mechanical properties, structurally stable—therefore preserving its properties—even after a prolonged use at temperatures between 700° to 1100° C.

Examples of compositions of materials are given herebelow, as well as Tables summarizing the result of tests to which said materials have been subjected.

In each of the Tables, the materials are defined by their composition. The mention of nickel at the head of each composition means that the material is nickel-based. The number preceding the atomic symbol of each other element is the percentage by weight, the complement to 100 being the nickel proportion.

SPECIFIC EXAMPLES

A- In a first family of composites according to the invention, the aluminum proportion in the basic composition of the material can reach 5% by weight. The formation of the $\gamma'$ precipitate is thereby favored. In order to avoid an excessive concentration of chromium in the $\gamma$ solid solution of the matrix, the invention reduces the chromium proportion in the starting composition of the material.

The characteristic double inequality of this first family is the following:

$$4\% < Al \leq 5\%$$

$$Cr \leq 8\%$$

EXAMPLE 1

A composite material belonging to the first family has the following composition by weight:

| Co | 10% |
|---|---|
| Cr | 8% |
| W | 10% |
| Al | 5% |
| Nb | 4.5% |
| C | 0.5% |
| Ni | balance to 100. |

The hardening of the matrix is more important that that of a material of the prior art having the following ponderal composition:

| Co | 20% |
|---|---|
| Cr | 10% |
| W | 10% |
| Al | 4% |
| Nb | 4.9% |
| C | 0.55% |
| Ni | balance to 100 | due to the increase of the $\gamma'$ phase precipitate.

The material of Example 1 has mechanical characteristics higher than the material of the prior art. It exhibits a good structural stability even after having been kept for 3000 hours at a temperature between 850° and 1000° C.

B- In a second family of composite materials according to the invention, the Al content is put up to 6% for obtaining a more abundant $\gamma'$ precipitate. For avoiding the development of the undesired $Cr_{23}C_6$ compound, the chromium content is, according to the invention, less than or equal to 6% by weight.

This family meets the following characteristic double inequality:

$$5\% < Al \leq 6\%$$

$$Cr \leq 6\%$$

An example of such a composite is given hereafter:

EXAMPLE 2

| Co | 10% |
|---|---|
| Cr | 6% |
| W | 10% |
| Al | 6% |
| Nb | 4.2% |
| C | 0.47% |
| Ni | balance to 100. |

The mechanical characteristics of said material are better than those of the known materials, and particularly of the hereabove mentioned prior art material.

The hereunder Tables I to III supply respectively for the materials of Examples 1 and 2 the results of the tests as defined at the head of each of said Tables. In said Tables are also shown the results obtained for the material of the prior art hereabove defined as well as the results obtained for the material of the hereafter Example 3.

The hereafter Table IV shows for the Ni—10 Co—10 W—5 Al—4.5 Nb—0.5 C—Cr composite (Example 1) the influence of the chromium content on the structural stability, after the material has been kept for 3000 hours at temperatures between 850° and 1000° C.

The hereafter Table V is similar to Table IV but for the Ni—10 Co—10 W—5 Al—4.2 Nb—0.47 C—Cr composite (Example 2).

Tables IV and V show that the materials of Examples 1 and 2 exhibit a good structural stability after having been kept for 3000 hours at temperatures between 850° and 1000° C. for a chromium content meeting the hereunder given limitations. They also show that, for a chromium content higher than the indicated limitations, the materials of Examples 1 and 2 exhibit a structural stability which is not as good.

TABLE I

TENSILE STRENGTH AT 1070° C.

| Composition (% by weight) | Specific mass $\rho$ (kg m$^{-3}$ × 10$^3$) | Solidification speed (cm/h) | Tension at 1070° C. Breaking load $\sigma$ (MPa) | Tension at 1070° C. Specific resistance $\sigma/\rho m^2 \cdot s^{-2} \times 10^3$ | Elongation (%) |
|---|---|---|---|---|---|
| Ni - 20 Co - 10 Cr - 10 W - 4 Al - 4.9 Nb - 0.55 C | 8.5 | 1.2 | 300 | 35.3 | 3.5 |
| Ni - 10 Co - 8 Cr - 10 W - 5 Al - 4.5 Nb - 0.5 C | 8.5 | 1.2 | 340 | 40 | 8 |
| Ni - 10 Co - 6 Cr - 10 W - 6 Al - 4.2 Nb - 0.47 C | 8.35 | 1.2 | 348 | 41.7 | 16 |
| Ni - 10 Co - 4 Cr - 10 W - 2 Mo - 6 Al - 3.8 Nb - 0.46 C | 8.5 | 1.2 | 406 | 47.8 | 11 |

TABLE II

Evolution of the stress R and the elongation at break A after tension between room temperature and 1070° C. (The composites are all prepared by unidirectional solidification at a speed of 1.2 cm/h)

| Temperature | Ni-20 Co-10 Cr-10 W-4 Al-4.9 Nb-0.55 C R MPa | Ni-20 Co-10 Cr-10 W-4 Al-4.9 Nb-0.55 C A % | Ni-10 Co-8 Cr-10 W-5 Al-4.5 Nb-0.5 C R MPa | Ni-10 Co-8 Cr-10 W-5 Al-4.5 Nb-0.5 C A % | Ni-10 Co-6 Cr-10 W-6 Al-4.2 Nb-0.47 C R MPa | Ni-10 Co-6 Cr-10 W-6 Al-4.2 Nb-0.47 C A % | Ni-10 Co-4 Cr-10 W-2 Mo-6 Al-3,8Nb-0.46 C R MPa | Ni-10 Co-4 Cr-10 W-2 Mo-6 Al-3,8Nb-0.46 C A % |
|---|---|---|---|---|---|---|---|---|
| 25° C. | 1550 | 12.4 | 1528 | 14.2 | 1470 | 15.8 | 1505 | 13 |
| 800 | 960–1100 | 7 | 1065 | 14.8 | 1040 | 7.8 | 1120–1220 | 12 |
| 900 | 680 | 7.7 | 730 | 16.4 | 760 | 10.6 | 910 | 10 |
| 1000 | 415 | 6.6 | 433 | 12.2 | 475 | 11.6 | 570 | 10 |
| 1070 | 300 | 5 | 340 | 8.2 | 348 | 16.4 | 406 | 11 |

TABLE III

CREEP BREAKING TIMES
(All the composites have been prepared by unidirectional solidification at the speed of 1.2 cm/h)

| Composition | Life time (in hours) at a temperature (°C.) and under a stress (MPa) of 1000° C./160 MPa | 1000° C./180 MPa | 1070° C./120 MPa |
|---|---|---|---|
| Ni-20 Co-10 Cr-10 W-4 Al-4.9 Nb-0.55 C | 442 h | 50 h | 500 h |
| Ni-10 Co-8 Cr-10 W-5 Al-4.5 Nb-0.5 C | 670 h | 154 h | 1200 h |
| Ni-10 Co-6 Cr-10 W-6 Al-4.2 Nb-0.47 C | 754 h | 140 h | 1225 h |
| Ni-10 Co-4 Cr-10 W-2 Mo-6 Al-3.8Nb-0.46C | 4180 h | 980 h | 2200 h |

TABLE IV

Influence of the chromium content of composite Ni - Cr - 10 Co - 10 W - 5 Al - 4.5 Nb - 0.5 C on its structural stability. Phases which have appeared after the composite has been kept for 3000 hours at average temperatures of 850 to 1000° C.

| T°C. | % Cr 7–7.5 | 7.6–8 | 8–8.5 | 9–10 |
|---|---|---|---|---|
| 850 | fibers intact some M$_{23}$'C$_6$ carbide at the grain boundaries | fibers intact M$_{23}$'C$_6$ carbide at the grain boundaries | carbide at the boundaries beginning of transformation | fibers partly transformed into M$_{23}$'C$_6$ |

TABLE IV-continued

Influence of the chromium content of composite
Ni - Cr - 10 Co - 10 W - 5 Al - 4.5 Nb - 0.5 C
on its structural stability. Phases which have
appeared after the composite has been kept for
3000 hours at average temperatures of 850 to 1000° C.

| T°C. | % Cr 7-7.5 | 7.6-8 | 8-8.5 | 9-10 |
|---|---|---|---|---|
| 900 | fibers intact $M_{23}'C_6$ carbide at grain boundaries | fibers intact in the matrix, $M_{23}'C_6$ at the grain boundaries | on some fibers $M_{23}'C_6$ carbide at the grain boundaries, beginning of transformation on some fibers | fibers partly transformed into $M_{23}'C_6$ |
| 950 | fibers intact some $M_{23}'C_6$ carbide at the grain boundaries | fibers intact $M_{23}'C_6$ carbide at the grain boundaries | fibers intact much carbides at the grain boundaries | fibers partly transformed into $M_{23}'C_6$ chromium carbide |
| 1000 | no chromium carbide | fibers intact very slightly $M_{23}'C_6$ carbides at the grain boundaries | fibers intact some carbide at the grain boundaries | fibers intact for Cr = 9% fibers partly transformed in $M_{23}'C_6$ for Cr = 10% |

TABLE V

Influence of the chromium content of composite:
Ni - Cr - 10 Co - 10 W - 6 Al - 4.2 Nb - 0.47 C
on its structural stability. Phases which have
appeared after the composite has been kept for
3000 hours at averages temperatures of 850 to 1000° C.

| T°C. | % Cr 5-5.5 | 5.5-6 | 6-6.5 | 6.5-7 |
|---|---|---|---|---|
| 850 | fibers intact no $M_{23}'C_6$ carbide for Cr < 5.3% | fibers intact $M_{23}'C_6$ carbide at the grain boundaries | much $M_{23}'C_6$ carbide at the grain boundaries some rare carbide in fibers in the matrix degraded fibers in boundaries | fibers transformed into $M_{23}'C_6$; |
| 900 | fibers intact practically no $M_{23}'C_6$ carbide at the grain boundaries | fibers intact $M_{23}'C_6$ carbides at the grain boundaries | fibers intact in the matrix, $M_{23}'C_6$ at the grain boundaries | fibers partly transformed into $M_{23}'C_6$; carbides at boundaries, fibers totally transformed for Cr ≧ 7% |
| 950 | fibers intact practically no $M_{23}'C_6$ when Cr ≦ 5.3% | fibers intact $M_{23}'C_6$ carbide at the grain boundaries Cr < 5.7% few carbides | $M_{23}'C_6$ carbides at the boundaries beginning of transformation of the fibers into $M_{23}'C_6$ | fibers partly transformed into $M_{23}'C_6$ carbides at the joints fibers totally transformed for Cr ≧ 7% |
| 1000 | no chromium carbide | fibers intact a few rare $M_{23}'C_6$ carbide at the grain boundaries | fibers intact in the matrix $M_{23}'C_6$ carbides at the grain boundaries | fibers little damaged $M_{23}'C_6$ at the grain boundaries α phase and Cr carbides on some fibers |

C- In a third family of materials according to the invention, the hardening of the matrix by precipitation of the γ' phase is further improved by a complementary increase of the aluminum content, which is raised to 7%. For ensuring the structural stability of the composite for long life periods, that is for avoiding the development of the undesired $Cr_{23}C_6$ compound, the chromium content is then lower or equal to 4% by weight. The double characteristic inequality of this third family is the following:

6% < Al ≦ 7%

Cr ≦ 4%

For an aluminum content of a composite which is higher than 7% by weight, the γ' phase would appear partly directly during the solidification process and would disturb the solidification of the composite.

On the contrary, in the composites according to the invention, a more important hardening of the matrix may be obtained by increasing the hardening of the matrix solid solution, and this by increasing the W content above 10% by weight. However, in order to preserve for the system a good structural stability, for W contents higher than 10% and likely to reach 14% by weight, the Cr content is brought down correspondingly so as not to be higher than 4% by weight for a W content of 14%, the choice of the chromium content being on the other hand always determined by taking in account the Al content.

The invention also allows partial replacement of the W by Mo, said constituent having also a hardening effect of the matrix in solid solution.

D- According to the invention, in this other family of materials, the Mo is present in a quantity by weight which can be as high as the half of that of W. Said composites meet the composition limitations given hereafter, the values being given on the one hand for materials comprising 6% aluminum, and, on the other hand, for materials comprising 7% of aluminum:

|  |  |  |
|---|---|---|
|  | Co | 0 to 20% by weight |
|  | W | 7 to 14% |
|  | Mo | 3 to 0% |
|  | Cr | ≦ 4% |
|  | Al | 6% |
|  | Nb | 3.5 to 6% |
|  | C | 0.4 to 0.65% |
|  | Ni | balance to 100 |
| and |  |  |
|  | Co | 0 to 20% by weight |
|  | W | 7 to 14% |
|  | Mo | 3 to 0% |
|  | Cr | ≦ 3.5% |
|  | Al | 7% |
|  | Nb | 3.5 to 5% |
|  | C | 0.35 to 0.55% |
|  | Ni | balance to 100. |

Particular examples of such materials are given hereafter:

EXAMPLE 3

| Co | 10% by weight |
|---|---|
| W | 10% |
| Mo | 2% |
| Al | 6% |
| Cr | 4% |
| Nb | 3.8% |
| C | 0.46% |
| Ni | balance to 100. |

EXAMPLE 4

| Co | 10% by weight |
|---|---|
| W | 10% |
| Mo | 2% |
| Cr | 3.5% |
| Al | 7% |
| Nb | 3.8% |
| C | 0.40% |
| Ni | balance to 100. |

EXAMPLE 5

| W | 10% by weight |
|---|---|
| Mo | 2% |
| Cr | 3.5% |
| Al | 7% |
| Nb | 3.8% |
| C | 0.40% |
| Ni | balance to 100. |

According to need, further elements such as Ta, V, Zr, Hf, Ti may also be added to the base system for improving the hardening by the γ' precipitate or the reinforcement by the monocarbide fibres. However, said elements must not be added in a quantity such that their distribution in the various phases of the composite would bring about a chromium content in the solid solution higher than 15% by weight. To this effect, it is considered according to the invention that such elements may be added up to 2% by weight of the base composition.

Examples of such composites are given hereunder:

EXAMPLE 6

| Co | 10% by weight |
|---|---|
| W | 10% |
| Mo | 2% |
| Al | 6% |
| Cr | 4% |
| Ti | 1% |
| V | 1% |
| Nb | 2.2% |
| C | 0.5% |
| Ni | balance to 100. |

EXAMPLE 7

| Co | 10% by weight |
|---|---|
| W | 10% |
| Al | 6% |
| Cr | 4% |
| Ta | 2% |
| Nb | 4.2% |
| C | 0.45% |
| Ni | balance to 100. |

EXAMPLE 8

| Co | 10% by weight |
|---|---|
| W | 10% |
| Al | 6% |
| Cr | 4% |
| Ta | 1% |
| Nb | 4.5% |
| C | 0.45% |
| Ni | balance to 100. |

The materials according to the invention, in spite of their relatively low Cr content, exhibit good behavior towards dry corrosion and oxidation at high temperature, as is shown in the hereafter Tables VI and VII relative to behavior tests of the composites in combustion gases containing 0.15% of sulphur and from 1 to 5 ppm of NaCl, at 850°, 950° and 1050° C.

It appears from Table VI that a composite according to the invention with 4% of chromium (Ni—10 Co—10 W—2 Mo—6 Al—4 Cr—3.8 Nb—0.46 C) exhibits a better behavior towards dry corrosion and oxidation at high temperature, in the conditions of the test, than the commercial alloy IN-100.

The invention foresees also the addition of yttrium (Y) to the materials in a proportion of 0.1 to 0.5% by weight in the case where a part made of the alloy is intended for being subjected to particularly severe conditions relative to oxidation and corrosion.

Table VIII stresses said properties for the alloy of the hereafter composition:

| Co | 10% |
|---|---|
| W | 10% |
| Mo | 2% |
| Cr | 4% |
| Al | 6% |
| Nb | 3.8% |
| C | 0.46% |
| Y | 0.2% |
| Ni | balance to 100. |

TABLE VI

Damage test in cyclical corrosion (3 cycles/24 hours)

Test conditions
- T.R.O. fuel
- 0.15% sulphur
- 3 times stoichiometric air
- 1 ppm NaCl in the combustion gas

| Composition | 850° C. | 950° C. | 1050° C. |
|---|---|---|---|
| Ni -20 Co -10 Cr - 10 W - 4 Al - 4.9 Nb - 0.55 C | 500 h* | 500 h* | 260 h |
| Ni - 10 Co - 8 Cr - 10 W - 5 Al - 4.5 Nb - 0.5 C | 500 h* | 500 h* | 500 h |
| Ni - 10 Co - 6 Cr - 10 W - 6 Al - 4.2 Nb - 0.47 C | 500 h* | 500 h* | 500 h |
| Ni - 10 Co - 4 Cr - 10 W - 2 Mo - 6 Al - 3.8 Nb - 0.46 C | 350 h | 500 h* | 500 h |
| Ni - 10 Co - 4 Cr - 10 W - 2 Mo - 0.2 Y - 6 Al - 3.8 Nb - 0.46 C | 500 h | 500 h* | 500 h |
| IN 100 | 140 h | 500 h* | 260 h |

*Test interrupted after 500 hours without appearance of damage.

TABLE VII

Damage test in cyclical corrosion (3 cycles per day)

Test conditions:
- T.R.O. fuel
- 0.15% sulphur
- 3 times stoichiometric air
- 5 ppm NaCl in the combustion gas Test duration in hours until apparition of damages

| Composition | 850° C. | 950° C. | 1050° C. |
|---|---|---|---|
| Ni -20 Co - 10 Cr -10 W - 4 Al - 4.9 Nb - 0.55 C | 90 h | 473 h | 235 h |
| Ni - 10 Co - 8 Cr - 10 W - 5 Al - 4.5 Nb - 0.5 C | 90 h | 112 h | 453 h |
| Ni - 10 Co - 6 Cr - 10 W - 6 Al - 4.2 Nb - 0.47 C | 110 h | 191 h | 500 h |
| Ni - 10 Co - 4 Cr - 10 W - 2 Mo - 6 Al - 3.8 Nb - 0.46 C | 90 h | 112 h | 429 h |
| Ni - 10 Co - 4 Cr - 10 W - 2 Mo - 0.2 Y - 6 Al - 3.8 Nb - 0.46 C | 90 h | 88 h | 425 h |
| IN 100 | 40 h | 40 h | 425 h |

The addition of yttrium within the ranges given hereabove does not affect the mechanical properties of the materials according to the invention. The structural stability of the materials of the invention is also not affected by the addition of yttrium.

Table VIII shows, for alloys of the hereafter ponderal composition, the influence of the addition of yttrium on their behavior to creep:

(a)
| Co | 10% |
|---|---|
| W | 10% |
| Mo | 2% |
| Cr | 4% |
| Al | 6% |
| Nb | 3.8% |
| C | 0.46 |
| Y | 0.2% |
| Ni | balance to 100. |

(b)
| Co | 10% |
|---|---|
| W | 10% |
| Cr | 8% |
| Al | 5% |
| Nb | 4.5% |
| C | 0.5% |
| Y | 0.2% |
| Ni | balance to 100. |

TABLE VIII

INFLUENCE OF THE ADDITION OF YTTRIUM ON THE BEHAVIOR TO CREEP
(All the composites have ben prepared by unidirectional solidification at the speed of 1.2 cm/h)

| | Composition | Test conditions | Secondary creep speed $\Delta l/l/t$ | Rupture time |
|---|---|---|---|---|
| (b) | Ni - 10 Co - 10 W - 8 Cr - 5 Al - 4.5 Nb - 0.5 C | 850° C./350 MPa | | 934 h |
| | Ni - 10 Co -10 W - 8 Cr - 5 Al - 4.5 Nb - 0.5 C - 0.2% Y | | | 1180 h |
| (a) | Ni - 10 Co - 10 W - 2 Mo - 4 Cr - 6 Al - 3.8 Nb -0.46 C | 900° C./340 MPa | $4.16 \times 10^{-5}/h$ | 158 h |
| | Ni - 10 Co - 10 W - 2 Mo - 4 Cr - 6 Al -3.8Nb -0.46 C 0.2% Y | | $2.87 \times 10^{-5}/h$ | 285 h |
| | Ni - 10 Co - 10 W - 2 Mo - 4 Cr - 6 Al -3.8 Nb- 0.46 C | 1000° C./210 Mpa | $2.62 \times 10^{-5}/h$ | 212 h |
| | Ni - 10 Co - 10 W - 2 Mo - 4 Cr - 6 Al - 3.8 Nb- 0.46 C 0.2 Y | | $1.73 \times 10^{-5}/h$ | 255 h |

We claim:

1. A refractory composite material adapted to be used in the manufacture of aviation turbine blades, and obtained by unidirectional solidification, with a nickel-based matrix hardened by at least one element including W in solid solution and hardened by precipitation from the matrix of a $\gamma'$ (Ni,Xi)$_3$(Al,Yi) phase, Xi representing elements different from Ni, and Yi representing elements different from Al and which can be respectively substituted for Ni and Al atoms in the formation of the $\gamma'$ precipitate, and with aligned monocrystalline fibers of niobium monocarbide imbedded in said matrix, said material consisting essentially by weight of hardening elements

| Co | 0 to 20%, |
|---|---| selected from the group which consists of

| W and Mo | 7 to 14%, |
|---|---|
| Al | 5 to 7%, |
| Nb | 3.5 to 6% |
| C | 0.35 to 0.65%, and |
| Ni | balance to 100% | the chromium proportion being at most 8% by weight and being at a value less than that at which a chromium carbide of formula $Cr_{23}C_6$ can form in the matrix at the expense of the niobium monocarbide of the reinforcement fibers at the operating temperature foreseen for the material.

2. A composite material according to claim 1 with an aluminum content of 5% by weight.

3. A composite material according to claim 2 of the following composition by weight:

| | |
|---|---|
| Co | 10% |
| Cr | 8% |
| W | 10% |
| Al | 5% |
| Nb | 4.5% |
| C | 0.5% |
| Ni | balance to 100% |

4. A composite material according to claim 1, wherein the aluminum content is 6% by weight and the chromium content is at most equal to 6% by weight.

5. A composite material according to claim 4 of the following composition by weight:

| | |
|---|---|
| Co | 10% |
| Cr | 6% |
| W | 10% |
| Al | 6% |
| Nb | 4.2% |
| C | 0.47% |
| Ni | balance to 100% |

6. A composite material according to claim 4 comprising 6% by weight Al and 4% by weight Cr.

7. A composite material according to claim 1 wherein the aluminum content is 7% by weight the chromium content is at most equal to 4% by weight.

8. A composite material according to claim 1 wherein Mo is included in the stated proportion of the hardening element.

9. A composite material according to claim 8 wherein the proportion of Mo by weight is at most equal to half of that of W.

10. A composite material according to claim 8 wherein the composition by weight is the following:

| | |
|---|---|
| Co | 0 to 20% by weight |
| W | 7 to 14% |
| Mo | 3 to 0% |
| Cr | ≦4% |
| Al | 6% |
| Nb | 3.5 to 6% |
| C | 0.4 to 0.65% |
| Ni | balance to 100% |

11. A composite material according to claim 10 with the following composition by weight:

| | |
|---|---|
| Co | 10% |
| W | 10% |
| Mo | 2% |
| Cr | 4% |
| Al | 6% |
| Nb | 3.8% |
| C | 0.46% |
| Ni | balance to 100% |

12. A composite material according to claim 8 with the following composition by weight:

| | |
|---|---|
| Co | 0 to 20% |
| W | 7 to 14% |
| Mo | 3 to 0% |
| Cr | ≦3.5% |
| Al | 7% |
| Nb | 3.5 to 5% |
| C | 0.35 to 0.55% |
| Ni | balance to 100% |

13. A composite material according to claim 12 with the following composition by weight:

| | |
|---|---|
| Co | 10% |
| W | 10% |
| Mo | 2% |
| Cr | 3.5% |
| Al | 7% |
| Nb | 3.8% |
| C | 0.40% |
| Ni | balance to 100% |

14. A composite material according to claim 12 with the following composition by weight:

| | |
|---|---|
| W | 10% by weight |
| Mo | 2% |
| Cr | 3.5% |
| Al | 7% |
| Nb | 3.8% |
| C | 0.40% |
| Ni | balance to 100% |

15. A composite material according to claim 1 further comprising yttrium in a proportion between 0.1 and 0.5% by weight.

16. A composite material according to claim 15 with the following composition by weight:

| | |
|---|---|
| Co | 10% |
| W | 10% |
| Mo | 2% |
| Cr | 4% |
| Al | 6% |
| Nb | 3.8% |
| C | 0.46% |
| Y | 0.2% |
| Ni | balance to 100% |

17. A composite material according to claim 1 further comprising Ta and/or V and/or Hf and/or Ti in a proportion at most equal to 2% by weight.

* * * * *

UNITED STATES PATENT AND TRADEMARK OFFICE
CERTIFICATE OF CORRECTION

PATENT NO. : 4 318 756
DATED : 9 March 1982
INVENTOR(S) : Herve Bibring et al

It is certified that error appears in the above-identified patent and that said Letters Patent is hereby corrected as shown below:

Column 12, claim 1, line 45 should read:

-- material consisting essentially by weight of --;

line 46 should be deleted;

line 51 should read:

-- hardening elements selected from the group which consists of --.

Signed and Sealed this

First Day of February 1983

[SEAL]

Attest:

Attesting Officer

GERALD J. MOSSINGHOFF

Commissioner of Patents and Trademarks